United States Patent
Brambilla et al.

(10) Patent No.: US 12,081,122 B2
(45) Date of Patent: Sep. 3, 2024

(54) ADJUSTABLE DRIVE SWITCHING CONVERTER

(71) Applicant: STMicroelectronics S.r.l., Agrate Brianza (IT)

(72) Inventors: Niccolo' Brambilla, Cassina de' Pecchi (IT); Sandro Rossi, Pavia (IT); Valeria Bottarel, Novara (IT); Alessandro Nicolosi, Dresano (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 269 days.

(21) Appl. No.: 17/532,867

(22) Filed: Nov. 22, 2021

(65) Prior Publication Data

US 2022/0166321 A1    May 26, 2022

(30) Foreign Application Priority Data

Nov. 24, 2020   (IT) .................. 102020000028199

(51) Int. Cl.
*H02M 1/08* (2006.01)
*H02M 1/00* (2006.01)
*H02M 3/158* (2006.01)
*H03K 17/687* (2006.01)

(52) U.S. Cl.
CPC ......... *H02M 3/158* (2013.01); *H02M 1/0006* (2021.05); *H02M 1/08* (2013.01); *H03K 17/687* (2013.01); *H03K 2217/0081* (2013.01)

(58) Field of Classification Search
CPC .... H02M 3/158; H02M 3/156; H02M 1/0006; H02M 1/08; H02M 1/0048; H03K 17/687; H03K 2217/0081
See application file for complete search history.

(56) References Cited

U.S. PATENT DOCUMENTS

| | | | | |
|---|---|---|---|---|
| 7,679,218 | B1* | 3/2010 | Isham | H02M 1/08 307/75 |
| 10,691,153 | B1* | 6/2020 | Tsai | H02M 1/08 |
| 2006/0038547 | A1* | 2/2006 | Ahmad | H02M 1/08 323/284 |
| 2008/0001553 | A1 | 1/2008 | Qiu et al. | |
| 2008/0007241 | A1* | 1/2008 | Isham | H02M 1/08 323/285 |

(Continued)

FOREIGN PATENT DOCUMENTS

| | | |
|---|---|---|
| CN | 105871180 A | 8/2016 |
| EP | 3109986 A1 | 12/2016 |
| EP | 3709494 A2 | 9/2020 |

*Primary Examiner* — Kyle J Moody
*Assistant Examiner* — Jye-June Lee
(74) *Attorney, Agent, or Firm* — Slater Matsil, LLP

(57) ABSTRACT

In an embodiment, a switching converter includes: a switching stage configured to receive a direct current input voltage, receive a driving signal for driving the switching stage, and provide a direct current output voltage according to the input voltage and the driving signal; a driving stage configured to provide the driving signal to the switching stage; a current sensing circuit configure to sense an output current provided by the switching stage; and a voltage generation circuit configured to generate at least one supply voltage for powering the driving stage, and adjust the at least one supply voltage according to the output current.

18 Claims, 7 Drawing Sheets

(56) References Cited

U.S. PATENT DOCUMENTS

| | | | |
|---|---|---|---|
| 2008/0061757 A1* | 3/2008 | Khayat | H02M 3/1588 |
| | | | 323/283 |
| 2008/0258697 A1* | 10/2008 | Gehrke | H02M 3/1588 |
| | | | 323/283 |
| 2008/0278135 A1 | 11/2008 | De Lima Filho et al. | |
| 2008/0290848 A1* | 11/2008 | Nguyen | H02M 3/156 |
| | | | 323/282 |
| 2008/0290911 A1 | 11/2008 | Williams | |
| 2009/0267682 A1 | 10/2009 | Hehemann et al. | |
| 2010/0007320 A1* | 1/2010 | Qiu | H02M 3/1588 |
| | | | 323/285 |
| 2012/0001608 A1* | 1/2012 | Sato | H02M 3/1588 |
| | | | 323/282 |
| 2014/0266091 A1 | 9/2014 | Zuniga et al. | |
| 2014/0266130 A1 | 9/2014 | Chiang et al. | |
| 2015/0008890 A1 | 1/2015 | Sasao et al. | |
| 2015/0222172 A1 | 8/2015 | Thakur | |
| 2016/0079785 A1 | 3/2016 | Kinzer et al. | |
| 2020/0287534 A1 | 9/2020 | Dietrich et al. | |
| 2021/0006245 A1* | 1/2021 | Kong | H02M 1/08 |
| 2022/0166320 A1* | 5/2022 | Brambilla | H02M 1/08 |

* cited by examiner

ADJUSTABLE DRIVE SWITCHING CONVERTER

CROSS-REFERENCE TO RELATED APPLICATIONS

This application claims the benefit of Italian Patent Application No. 102020000028199, filed on Nov. 24, 2020, which application is hereby incorporated herein by reference.

This application is related to U.S. patent application Ser. No. 17/532,833, filed on the same day as this application, entitled "Switching Converter," and associated with, now U.S. Pat. No. 11,888,384, issued Jan. 30, 2024, and claiming the benefit of Italian Patent Application No. 102020000028178, filed on Nov. 24, 2020, which applications are hereby incorporated herein by reference.

TECHNICAL FIELD

The present disclosure relates generally to an electronic system and method, and, in particular embodiments, to a switching converter.

BACKGROUND

DC-DC switching converters may be used in any electronic system comprising a power source (such as a battery) and one or more electronic/electro-mechanic components each one operating at a respective voltage. In such an electronic system, the DC-DC switching converter may be configured to generate multiple controlled output voltages from a (single) input voltage provided by the power source. This allows saving space, in that the use of multiple power sources within the electronic system to supply different components thereof is avoided.

Among the switching converters, the switching converters wherein the output voltage is lower than the input voltage (also referred to as buck converters or step-down converters) are widely used.

A conventional buck converter comprises a switching stage, and a driving stage for driving the switching stage.

According to a common implementation, the switching stage comprises a high-side switching device (such as a PMOS transistor or a NMOS transistor) and a low-side switching device (such as a NMOS transistor) alternatively turned on and off according to respective driving signals.

According to a common implementation, the driving stage comprises a high-side driving device (for example, a tapered buffer arrangement) for receiving an oscillating signal (e.g., a pulse width modulated (PWM) signal) and for providing the corresponding driving signal to the high-side switching device, and a low-side driving device (for example, a tapered buffer arrangement) for receiving the oscillating signal and for providing the corresponding driving signal to the low-side switching device.

The high-side and low side driving devices are typically powered with respective supply voltages.

The supply voltages powering the high-side driving device typically comprise a high or relatively high supply voltage (for example, the input voltage when the high-side switching device is a PMOS transistor) and a low or relatively low supply.

The supply voltages powering the low-side driving device typically comprise a high or relatively high supply voltage and a low or relatively low supply voltage (typically, a ground voltage).

SUMMARY

The Applicant has understood that the conventional switching converters may not be satisfactory for modern technological requirements, and particularly for applications wherein high efficiency is required.

Indeed, the Applicant has recognized that, in the prior-art solutions, one or more of the supply voltages (such as the low or relatively low supply voltage powering the high-side driving device and the high or relatively high supply voltage powering the low-side driving device) are fixed (for example, they may be internally generated or externally provided), and that therefore they cannot be used to achieve power loss optimization.

Thus, in the conventional switching converters, driving losses are usually optimized by acting on design parameters of the switching devices. Just as an example, introducing modularity for the switching devices or changing a switching frequency are commonly used approach aimed at achieving power loss optimization.

However, introducing modularity for the switching devices implies a high design complexity for the driving devices, and changing the switching frequency implies a higher system complexity and huge effort on state machine for managing the switching devices.

The Applicant has faced the above-mentioned issues, and has devised embodiments of a switching converter with optimized power losses and reduced complexity. In order to achieve it, in some embodiments, the Applicant has devised a switching converter in which one or more of the supply voltages powering the high-side driving device and the low-side driving device are variable, and adjustable according to an output current of the switching converter.

One or more aspects of some embodiments are set out in the independent claims, with advantageous features of the same embodiments that are indicated in the dependent claims, whose wording is enclosed herein verbatim by reference (with any advantageous feature being provided with reference to a specific aspect of the present invention that applies mutatis mutandis to any other aspect).

Some embodiments relate to a switching converter for converting a direct current input voltage into a direct current output voltage. The switching converter may comprise a switching stage for receiving the direct current input voltage and for providing the direct current output voltage according to the direct current input voltage and to a driving signal driving the switching stage. The switching converter may comprise a driving stage for providing the driving signal. The switching converter may comprise a current sensing arrangement for sensing an output current provided by the switching stage. The switching converter may comprise a voltage generation arrangement configured to generate at least one supply voltage for powering the driving stage; the voltage generation arrangement may be configured to adjust the at least one supply voltage according to the output current being sensed by the sensing arrangement.

According to an embodiment, whose features are additional or alternative to any features of the preceding embodiments, the switching stage comprises first and second switching devices and the driving stage comprises first and second driving devices for driving the first and second switching devices, respectively. The voltage generation arrangement may comprise a first voltage generation stage configured to generate, according to the output current, a first supply voltage for powering the second driving device, and a second voltage generation stage configured to generate a second supply voltage for powering the first driving device.

According to an embodiment, whose features are additional or alternative to any features of the preceding embodiments, the second voltage generation stage is configured to generate the second supply voltage according to a reference voltage corresponding to the first supply voltage.

According to an embodiment, whose features are additional or alternative to any features of the preceding embodiments, the first voltage generation stage comprises a reference current generator configured to generate a reference current, and a reference voltage generator configured to generate, according to the reference current, the reference voltage. At least one between the reference current and the reference voltage may be adjustable according to the output current.

According to an embodiment, whose features are additional or alternative to any features of the preceding embodiments, the first voltage generation stage comprises a decoupling stage configured to provide, according to the reference voltage, the first supply voltage while electrically decoupling the first voltage generation stage and the second driving device to each other.

According to an embodiment, whose features are additional or alternative to any features of the preceding embodiments, the first switching device comprises a PMOS transistor and the second switching device comprises a NMOS transistor. The second voltage generation stage may comprise a first impedance network configured to receive the first supply voltage and to provide a corresponding further reference current, a second impedance network configured to receive the input voltage ($V_{IN}$) and the further reference current and to provide the second supply voltage, and a current mirror arrangement configured to mirror the further reference current from the first impedance network to the second impedance network.

According to an embodiment, whose features are additional or alternative to any features of the preceding embodiments, the second impedance network is equal to the first impedance network.

According to an embodiment, whose features are additional or alternative to any features of the preceding embodiments, the reference current is adjustable according to the output current and the reference voltage generator comprises a third impedance network. The third impedance network may be equal to the first impedance network.

According to an embodiment, whose features are additional or alternative to any features of the preceding embodiments, the second voltage generation stage shares the first impedance network with the reference voltage generator of the first voltage generation stage. The third impedance network of the reference voltage generator may act also as the first impedance network of the second voltage generation stage.

According to an embodiment, whose features are additional or alternative to any features of the preceding embodiments, the first switching device comprises a first NMOS transistor and the second switching device comprises a second NMOS transistor. The second voltage generation stage may comprise a bootstrap circuit for receiving the first supply voltage and for providing the second supply voltage; the bootstrap circuit may be configured to keep a voltage between gate and source terminals of the first NMOS transistor at the first supply voltage regardless of the input voltage.

According to an embodiment, whose features are additional or alternative to any features of the preceding embodiments, the switching converter is a buck converter, a boost converter or a buck-boost converter.

Some embodiments relate to an electronic system comprising such a switching converter (or more thereof).

Some embodiments relate to a method for converting, in a switching converter, a direct current input voltage into a direct current output voltage. The switching converter may comprise a switching stage for receiving the direct current input voltage and for providing the direct current output voltage according to the direct current input voltage and to a driving signal driving the switching stage, and a driving stage for providing the driving signal. The method may comprise sensing an output current provided by the switching stage. The method may comprise generating at least one supply voltage for powering the driving stage, the generating comprising adjusting the at least one supply voltage according to the output current being sensed.

BRIEF DESCRIPTION OF THE DRAWINGS

These and other features and advantages of the present invention will be made apparent by the following description of some exemplary and non-limitative embodiments thereof. For its better intelligibility, the following description should be read making reference to the attached drawings, wherein.

DETAILED DESCRIPTION OF ILLUSTRATIVE EMBODIMENTS

Figure 1:
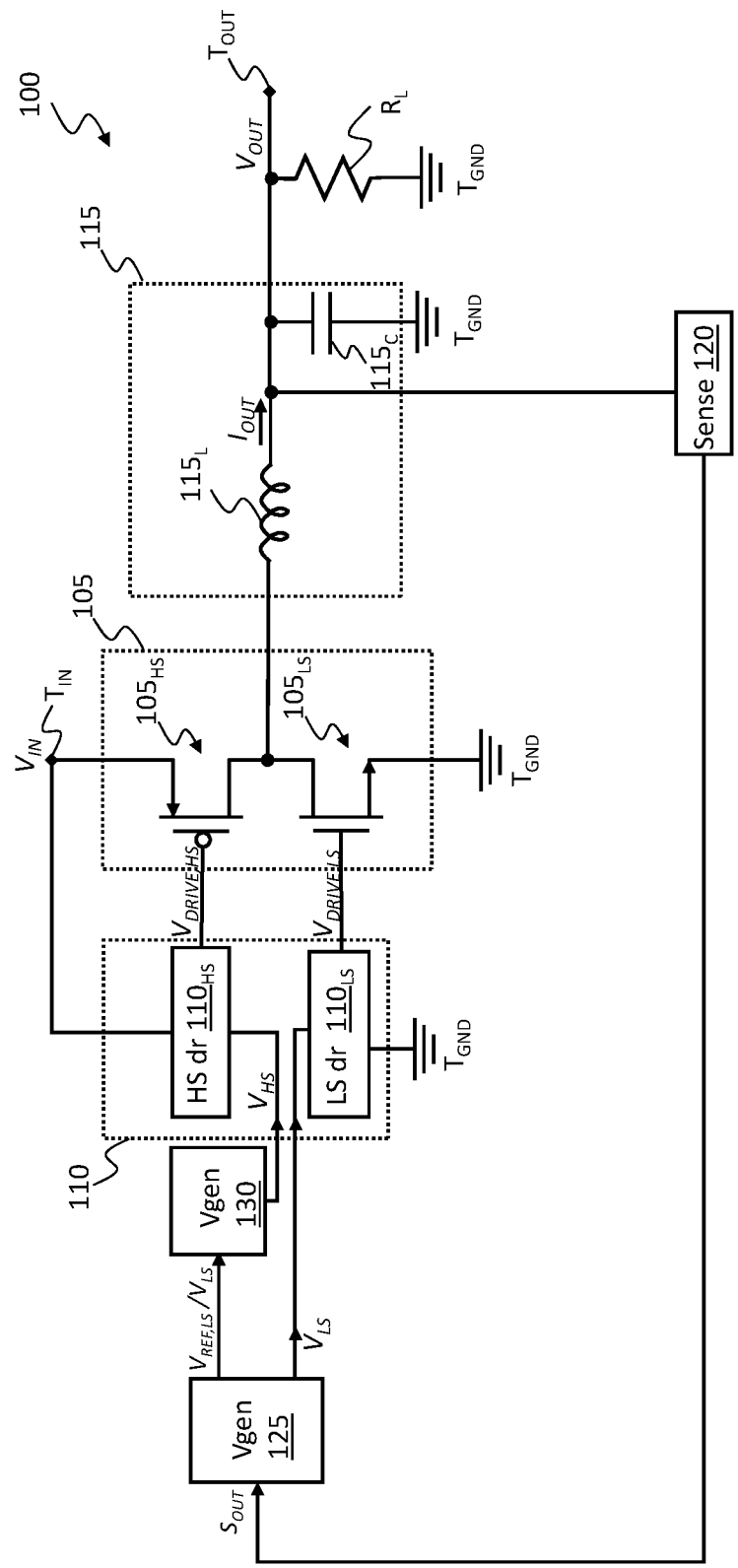
FIG. 1 shows a simplified circuit diagram of a switching converter according to an embodiment of the present invention.

With reference to the drawings, FIG. 1 shows a simplified circuit diagram of a switching converter 100 according to an embodiment of the present invention.

In the following, when one or more features of the switching converter 100 are introduced by the wording "according to an embodiment", they are to be construed as features additional or alternative to any features previously introduced, unless otherwise indicated and/or unless there is evident incompatibility among feature combinations.

According to an embodiment, the switching converter 100 is a DC-DC switching converter, i.e., a switching converter configured to convert a direct current (DC) input voltage $V_{IN}$ into a direct current (DC) output voltage $V_{OUT}$.

According to an embodiment, the output voltage $V_{OUT}$ is lower than or equal to the input voltage $V_{IN}$, i.e., the switching converter 100 is a step-down converter (or buck converter). However, the principles of some embodiments of the present invention equivalently apply to other switching converters, such as step-up converters (or boost converters), in which the output voltage $V_{OUT}$ is higher than the input voltage $V_{IN}$, or a combination of step-down and step-up converters (or buck-boost converters).

Without losing generality, the switching converter 100 may be used in any electronic system comprising a power source (such as a battery) and one or more electronic/electro-mechanic components each one operating at a respective voltage: in such an electronic system the switching converter 100 (or more thereof) may be configured to generate multiple controlled output voltages from a single input voltage provided by the power source (thus saving space, in that the use of multiple power sources within the electronic system to supply different components thereof is avoided). Examples of such an electronic system include a desktop computer, a server, a laptop computer, a media player (such as an MP3 player), an appliance, a subnotebook/netbook, a tablet computer, a smartphone, a cellular telephone, a network appliance, a personal digital assistant (PDA), a toy, a controller, a digital signal processor, a game console, a device controller, a portable computing device and/or a portable electronic device.

According to an embodiment, the switching converter 100 comprises an input terminal $T_{IN}$ providing the input voltage $V_{IN}$, and an output terminal $T_{OUT}$ providing the output voltage $V_{OUT}$.

According to an embodiment, the switching converter 100 comprises a switching stage 105 for receiving the input voltage $V_{IN}$ and for providing the output voltage $V_{OUT}$ according to the input voltage $V_{IN}$ and to a driving signal driving the switching stage 105 (as discussed in the following).

According to an embodiment, the switching stage 105 comprises a CMOS switching stage.

According to an embodiment, the switching stage 105 comprises a high-side switching device $105_{HS}$ and a low-side switching device $105_{LS}$. In the following, the high-side switching device $105_{HS}$ and the low-side switching device $105_{LS}$ will be also concisely denoted by switching devices $105_{HS}$, $105_{LS}$, when distinguishing between the high-side switching device $105_{HS}$ and the low-side switching device $105_{LS}$ is not relevant for the understanding of the present invention.

According to an embodiment, the high-side switching device $105_{HS}$ comprises a PMOS transistor. In the exemplary considered embodiment, the PMOS transistor comprises a source terminal electrically coupled (e.g., directly connected) to the input terminal $T_{IN}$ for receiving the input voltage $V_{IN}$, a gate terminal for receiving a respective driving signal $V_{DRIVE,HS}$ (hereinafter, high-side driving signal), and a drain terminal electrically coupled to the output terminal $T_{OUT}$ of the switching converter 100.

According to an embodiment, the low-side switching device $105_{LS}$ comprises a NMOS transistor. According to an embodiment, the NMOS transistor comprises a source terminal electrically coupled (e.g. directly connected) to a ground terminal $T_{GND}$ providing a ground voltage (for example, 0V), a gate terminal for receiving a respective driving signal $V_{DRIVE,LS}$ (hereinafter, low-side driving signal), and a drain terminal electrically coupled (e.g., directly connected) to the drain terminal of the PMOS transistor $105_{HS}$.

Therefore, in the considered embodiment, the switching stage 105 implements a so-called PMOS-NMOS half-bridge configuration.

According to an embodiment, the switching converter 100 comprises a driving stage 110 for driving the switching stage.

In the exemplary considered embodiment, the driving stage 110 comprises a high-side driving device (hereinafter, high-side driver) $110_{HS}$ (for example, a tapered buffer arrangement) for receiving an oscillating signal (for example, a PWM signal), not shown, and for providing to the high-side switching device $105_{HS}$ (particularly, to the gate terminal of the PMOS transistor) the high-side driving signal $V_{DRIVE,HS}$ (the high-side driving signal $V_{DRIVE,HS}$ being for example a respective regenerated version of the oscillating signal), and a low-side driving device (hereinafter, low-side driver) $110_{LS}$ (for example, a tapered buffer arrangement) for receiving the oscillating signal and for providing to the low-side switching device $105_{LS}$ (particularly, to the gate terminal of the NMOS transistor) the low-side driving signal $V_{DRIVE,LS}$ (the low-side driving signal $V_{DRIVE,LS}$ being for example a respective regenerated version of the oscillating signal).

According to an embodiment, the driving stage 11o is powered by one or more supply voltages.

According to an embodiment, the high-side driver $110_{HS}$ is powered with respective supply voltages. According to an embodiment, the supply voltages powering the high-side driver $110_{HS}$ comprise a high or relatively high supply voltage and a low or relatively low supply voltage $V_{HS}$. According to an embodiment, the high or relatively high supply voltage powering the high-side driver $110_{HS}$ comprises the input voltage $V_{IN}$ (as conceptually illustrated in the figure by electrical connection between the high-side driver $110_{HS}$ and the input terminal $T_{IN}$).

According to an embodiment, the low-side driver $110_{LS}$ is powered with respective supply voltages. According to an embodiment, the supply voltages powering the low-side driver $110_{LS}$ comprise a high or relatively high supply voltage $V_{LS}$ and a low or relatively low supply voltage. According to an embodiment, the low or relatively low supply voltage powering the low-side driver $110_{LS}$ comprises the ground voltage (as conceptually illustrated in the figure by electrical connection between the low-side driver $110_{LS}$ and the ground terminal $T_{GND}$).

In the following, the low or relatively low supply voltage $V_{HS}$ powering the high-side driver $110_{HS}$ and the high or relatively high supply voltage $V_{LS}$ powering the low-side driver $110_{LS}$ will be referred to as high-side supply voltage $V_{HS}$ and low-side supply voltage $V_LS$, respectively.

According to an embodiment, the high-side driver $110_{HS}$ and the low-side driver $110_L$ have a same supply voltage drop $V_{CC}$ between the respective supply voltages. In the considered example:

$$V_{CC} = V_{IN} - V_{HS}$$

$$V_{CC} = V_{LS}$$

However, in alternative embodiments (not shown), the supply voltage drop of the high-side driver $110_{HS}$ may be different from the supply voltage drop of the low-side driver $110_{LS}$.

According to an embodiment, the switching converter 100 comprises a filtering stage 115 electrically coupled to the switching stage 105. According to an embodiment, the filtering stage 115 is electrically coupled to the drain terminal of the PMOS transistor (and, hence, to the drain terminal of the NMOS transistor).

According to an embodiment, the filtering stage 115 comprises a LC filtering stage.

According to an embodiment, the filtering stage 115 comprises an inductor element $115_L$ (or more thereof) having a first terminal electrically coupled (e.g., directly connected) to the drain terminal of the PMOS transistor (and, hence, to the drain terminal of the NMOS transistor) and a second terminal electrically coupled (e.g., directly connected) to the output terminal $T_{OUT}$ of the switching converter 100, and a capacitor element $115_C$ (or more thereof) having a first terminal electrically coupled (e.g., directly connected) to the first terminal of the inductor element $115_L$ (and, hence, to the output terminal $T_{OUT}$ of the switching converter 100) and a second terminal electrically coupled (e.g., directly connected) to the ground terminal $T_{GND}$.

Therefore, in the considered embodiment, the switching stage 105 is electrically coupled to the output terminal $T_{OUT}$ of the switching converter 100 through the filtering stage 115.

According to an embodiment, each driving signal $V_{DRIVE,HS}$, $V_{DRIVE,LS}$ is a digital signal, i.e., a signal that may take a low logic level (for example corresponding to a reference or ground voltage, such as 0 V) and a high logic level (for example, corresponding to a positive voltage higher than the reference voltage, such as 3.4 V).

According to an embodiment, as mentioned above, each driving signal $V_{DRIVE,HS}$, $V_{DRIVE,LS}$ is provided (e.g., generated) from an oscillating signal (e.g., a PWM signal), not shown.

According to an embodiment, the oscillating signal is a square-wave signal with duty cycle d. According to an embodiment, the duty cycle d of the oscillating signal is dynamically variable so as to accordingly vary a conversion factor ($V_{OUT}/V_{IN}$) of the switching converter 100.

According to an embodiment, depending on the value of the respective driving signal $V_{DRIVE,HS}$, $V_{DRIVE,LS}$, each switching device $105_{HS}$, $105_{LS}$ may take a closed or ON state in which an electric current is allowed to flow across it, and an open or OFF state in which no electric current is allowed to flow across it.

As mentioned above, the switching converter 100 may be used in any electronic system. According to an embodiment, the switching converter 100 is configured to be electrically coupled to one or more modules of an electronic system. Such modules are conceptually represented in the figure by an equivalent resistor element $R_L$, hereinafter referred to as load resistor, having a first terminal electrically coupled (e.g., directly connected) to the output terminal $T_{OUT}$ of the switching converter 100 and a second terminal electrically coupled (e.g., directly connected) to the ground terminal $T_{GND}$.

According to an embodiment, the switching converter 100 comprises a sensing arrangement 120 configured to sense an electric current output by the switching stage 105 (hereinafter, concisely, output current $I_{OUT}$). In some embodiments, the sensing arrangement 120 may be implemented as a conventional current sensing circuit.

Some embodiments optimize power loses in the switching converter 100 by making the high-side supply voltage $V_{HS}$ and the low-side supply voltage $V_{LS}$ variable according to the output current $I_{OUT}$.

The principles underlying the idea of making the high-side supply voltage $V_{HS}$ and the low-side supply voltage $V_{LS}$ variable according to the output current $I_{OUT}$ are summarized here below.

Let be assumed that the power losses $P_{loss}$ of the switching converter 100 may be regarded as mainly determined by conduction losses $P_{Joule}$ and driving losses $P_{Driving}$ (i.e., let be assumed that switching losses, dynamic losses, parasitic coil losses and bias losses may be disregarded):

$$P_{loss} = P_{Joule} + P_{Driving}$$

$$P_{Joule} = [d*R_{switch} + (1-d)*R_{switch}]*I_{OUT}^2 =$$

$$= R_{switch}*I_{OUT}^2$$

$$P_{Driving} = C_g * V_{CC} * V_{IN} * f_{sw}$$

wherein:

d represents the duty cycle;

$R_{switch}$ represents the resistance exhibited by the high-side switching device $105_{HS}$ in the ON state and by the low-side switching device $105_{LS}$ in the ON state;

$I_{OUT}$ represents the output current;

$C_g$ represents the equivalent capacitance exhibited at control terminals of the high-side $105_{HS}$ and low-side $105_{LS}$ switching devices (e.g., at the gate terminals of the respective transistors);

$V_{CC}$ represents the supply voltage drop across the high-side driver $110_{HS}$ and across the low-side driver $110_{LS}$; and $f_{sw}$ represents a switching frequency of the switching converter 110.

Denoting by $P_{OUT}$ the output power of the switching converter 100, the efficiency η of the switching converter 100 may therefore be expressed as:

$$\eta = \frac{P_{out}}{P_{out}+P_{loss}} = \frac{V_{OUT}*I_{OUT}}{V_{OUT}*I_{OUT}+R_{switch}*I_{OUT}^2+C_g*V_{CC}*V_{IN}*f_{sw}} =$$

$$\frac{1}{1+\frac{R_{switch}*I_{OUT}}{V_{OUT}}+\frac{C_g*V_{CC}*V_{IN}*f_{sw}}{V_{OUT}*I_{OUT}}}$$

Denoting by $\eta_D$ the reciprocal of the efficiency η, a maximum of the efficiency η as a function of the output current $I_{OUT}$ may be determined as:

$$\frac{d\eta_D}{dI_{OUT}} = \frac{d\left(1+\frac{R_{switch}*I_{OUT}}{V_{OUT}}+\frac{C_g*V_{CC}*V_{IN}*f_{sw}}{V_{OUT}*I_{OUT}}\right)}{dI_{OUT}} =$$

$$\frac{R_{switch}}{V_{OUT}} - \frac{C_g*V_{CC}*V_{IN}*f_{sw}}{V_{OUT}*I_{OUT}^2} = 0$$

and the output current $I_{OUT}$ corresponding to the maximum of the efficiency η is:

$$I_{OUT} = \sqrt{\frac{C_g*V_{CC}*V_{IN}*f_{sw}}{R_{switch}}}$$

Therefore, the maximum of the efficiency η is obtained when:

$$P_{Joule} = P_{Driving} = C_g * V_{CC} * V_{IN} * f_{sw}$$

In the considered example in which the switching devices $105_{HS}, 105_{LS}$ comprise MOS transistors, the conduction losses $P_{Joule}$ may be expressed as:

$$P_{Joule} = R_{switch} * I_{OUT}^2 = \frac{1}{k*(V_{CC}-V_T)} * I_{OUT}^2 \simeq \frac{1}{k*V_{CC}} * I_{OUT}^2$$

wherein k $V_T$ is the threshold voltage of the MOS transistors.

Minimization of power loss $P_{loss}$ as a function of the supply voltage drop $V_{CC}$ can be obtained as:

$$\frac{dP_{loss}}{dV_{cc}} = \frac{d(P_{Joule}+P_{Driving})}{dV_{cc}} = 0$$

$$\frac{dP_{loss}}{dV_{cc}} = \frac{I_{OUT}^2}{k*V_{cc}^2} + C_g * V_{IN} * f_{sw} = 0$$

$$V_{cc} = I_{OUT} * \sqrt{\frac{1}{k*C_g*V_{IN}*f_{sw}}} = Z_{eq} * I_{OUT}$$

According to the principles of some embodiments of the present invention, the switching converter 100 comprises a voltage generation arrangement configured to generate and to adjust the high-side supply voltage $V_{HS}$ and the low-side supply voltage $V_{LS}$ according to the output current $I_{OUT}$ (e.g., an indication thereof) as sensed by the sensing arrangement 120. According to an embodiment, the indication of the output current $I_{OUT}$ is fed to the voltage generation arrangement in the form of a corresponding control signal $S_{OUT}$ (as better discussed in the following, the control signal $S_{OUT}$ may be configured to control one or more controllable elements of the voltage arrangement).

According to an embodiment, as illustrated, the voltage generation arrangement comprises a voltage generation stage (hereinafter, low-side voltage generation stage) 125 configured to generate the low-side supply voltage $V_{LS}$ according to the control signal $S_{OUT}$, and a voltage generation stage (hereinafter, high-side voltage generation stage) 130 configured to generate the high-side supply voltage $V_{HS}$ according to the low-side supply voltage $V_{LS}$ (or according to a reference voltage $V_{REF,LS}$ corresponding to the low-side supply voltage $V_{LS}$), as better understood from the following discussion. However, in alternative embodiments (not shown), the high-side voltage generation stage 130 may be configured to generate the high-side supply voltage $V_{HS}$ irrespective of the low-side supply voltage $V_{LS}$. In these alternative embodiments, the low-side voltage generation stage 125 and the high-side voltage generation stage 130 may be independent from each other, i.e., they may be configured to generate the respective low-side supply voltage $V_{LS}$ and high-side supply voltage $V_{HS}$ in an uncorrelated manner (e.g., based on mutually different reference voltages received at their inputs), irrespective of the fact that the supply voltage drop of the high-side driver $110_{HS}$ is equal to or different from the supply voltage drop of the low-side driver $110_L$.

Figure 2:
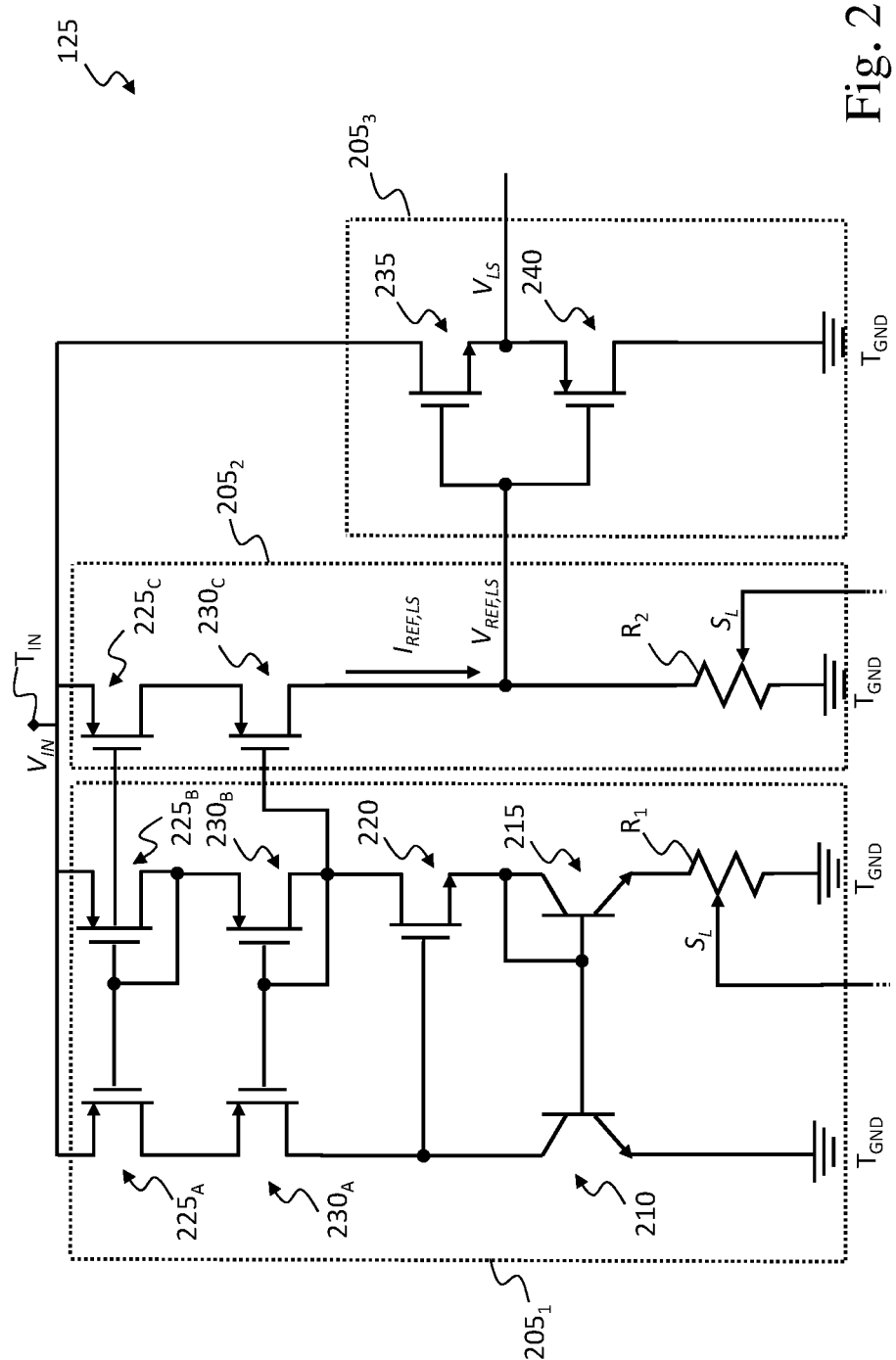
FIG. 2 shows a circuit implementation of a voltage generation stage of the switching converter according to an embodiment of the present invention.

With reference now to FIG. 2, it shows a circuit implementation of the low-side voltage generation stage 125 according to an embodiment of the present invention.

According to an embodiment, the low-side voltage generation stage 125 comprises a reference current generator $205_1$ configured to generate a reference current $I_{REF,LS}$.

According to an embodiment, the reference current generator $205_1$ comprises a current mirror-based current generator.

According to an embodiment, the current mirror-based current generator comprises a first generation transistor 210 (e.g., a BJT transistor) having an emitter terminal electrically coupled (e.g., directly connected) to the reference terminal $T_{GND}$, a second generation transistor 215 (e.g., a BJT transistor) having a base terminal electrically coupled (e.g., directly connected) to the base terminal of the first generation transistor 210 and a collector terminal electrically coupled (e.g., directly connected) to the respective base terminal (the second generation transistor 215 being thus in diode-connected configuration), a third generation transistor 220 (e.g., a NMOS transistor) having a source terminal electrically coupled (e.g., directly connected) to the collector terminal of the second generation transistor 215 and a gate terminal electrically coupled (e.g., directly connected) to the collector terminal of the first generation transistor 210, and an impedance network $R_1$ electrically coupled between the emitter terminal of the second generation transistor 215 and the ground terminal $T_{GND}$.

The impedance network $R_1$ is conceptually represented in the figure as a single resistor, although this should not be construed as a limitation.

According to an embodiment, the impedance network $R_1$ comprises a resistive network.

According to an embodiment, the impedance network $R_1$ is electrically coupled (e.g., directly connected) between the emitter terminal of the second generation transistor 215 and the ground terminal $T_{GND}$.

According to well-known principles of the current mirror-based current generators, the reference current $I_{REF,LS}$ flowing through the generation transistors 210, 215, 220 may be expressed as:

$$I_{REF,LS} = \frac{V_{th}*\ln(m)}{R_1}$$

wherein $V_{th}$ is the thermal voltage (approximately 26 mV at 300 K room temperature);

m represents a size ratio between the second generation transistor 215 and the first generation transistor 210;

$R_1$ denotes an impedance value of the impedance network $R_1$.

According to an embodiment, the current mirror-based current generator comprises a number of (e.g., two) first mirroring transistors between the input terminal $T_{IN}$ and the first generation transistor 210, and a same number of (e.g., two) second mirroring transistors between the input terminal $T_{IN}$ and the third generation transistor 220, the first and second mirroring transistors being arranged in current mirror configuration.

According to an embodiment, the first mirroring transistors comprise a mirroring transistor $225_A$ (e.g., a PMOS transistor) having a source terminal electrically coupled (e.g., directly connected) to the input terminal $T_{IN}$, and a mirroring transistor $230_A$ (e.g., a PMOS transistor) having a source terminal electrically coupled (e.g., directly connected) to a drain terminal of the mirroring transistor $225_A$, and a drain terminal electrically coupled (e.g., directly connected) to the gate terminal of the third generation transistor 220 (and, hence, to the collector terminal of the first generation transistor 210).

According to an embodiment, the second mirroring transistors comprise a mirroring transistor $225_B$ (e.g., a PMOS transistor) having a source terminal electrically coupled (e.g., directly connected) to the input terminal $T_{IN}$, a gate terminal electrically coupled (e.g., directly connected) to the gate terminal of the mirroring transistor $225_A$, and a drain terminal electrically coupled (e.g., directly connected) to the respective gate terminal (the mirroring transistor $225_B$ being thus in diode-connected configuration), and a mirroring transistor $230_B$ (e.g., a PMOS transistor) having a source terminal electrically coupled (e.g., directly connected) to the drain terminal of the mirroring transistor $225_B$, a gate terminal electrically coupled (e.g., directly connected) to the gate terminal of the mirroring transistor $230_A$, and a drain terminal electrically coupled (e.g., directly connected) to the respective gate terminal (the mirroring transistor $230_B$ being thus in diode-connected configuration) and to the drain terminal of the third generation transistor 220.

According to an embodiment, the low-side voltage generation stage 125 comprises a reference voltage generator $205_2$ configured to generate the reference voltage $V_{REF,LS}$ according to the reference current $I_{REF,LS}$.

According to an embodiment, the reference voltage generator $205_2$ comprises an impedance network $R_2$ (conceptually represented in the figure as a single resistor, although this should not be construed as a limitation).

According to an embodiment, the impedance network $R_2$ comprises a resistive network.

According to an embodiment, the impedance network $R_2$ is configured to be flown through by the reference current $I_{REF,LS}$, whereby the reference voltage $V_{REF,LS}$ depends on the reference current $I_{REF,LS}$ and an impedance value $R_2$ of the impedance network $R_2$.

According to an embodiment, the reference voltage generator $205_2$ comprises a number of (e.g., two) mirroring transistors (hereinafter, third mirroring transistors) electrically coupled to the first and second mirroring transistors of the reference current generator $205_1$ so as to receive the reference current $I_{REF,LS}$ therefrom. In other words, the first, second and third mirroring transistors implement, as a whole, a current mirror arrangement. According to an embodiment, the first, second and third mirroring transistors are designed such that the same reference current $I_{REF,LS}$ is allowed to flow through first, second and third circuit branches identified by the first, second and third mirroring transistors, respectively.

According to an embodiment, the third mirroring transistors comprise a mirroring transistor $225_C$ (e.g., a PMOS transistor) having a source terminal electrically coupled (e.g., directly connected) to the input terminal $T_{IN}$, a gate terminal electrically coupled (e.g., directly connected) to the gate terminals of the mirroring transistors $225_A, 225_B$, and a mirroring transistor $230_C$ (e.g., a PMOS transistor) having a source terminal electrically coupled (e.g., directly connected) to a drain terminal of the mirroring transistor $225_C$, a gate terminal electrically coupled (e.g., directly connected) to the gate terminals of the mirroring transistors $230_A, 230_B$, and a drain terminal electrically coupled (e.g., directly connected) to a first terminal of the impedance network $R_2$.

According to an embodiment, a second terminal of the impedance network $R_2$ is electrically coupled (e.g., directly connected) to the ground terminal $T_{GND}$, whereby the reference voltage $V_{REF,LS}$ across the impedance network $R_2$ may be expressed as:

$$V_{REF,LS} = I_{REF,LS} * R_2 = \frac{V_{th} * \ln(m)}{R_1} * R_2$$

wherein $R_2$ denotes an impedance value of the impedance network $R_2$.

According to an embodiment, at least one between the reference current $I_{REF,LS}$ and the reference voltage $V_{REF,LS}$ is adjustable (variable) according to the output current $I_{OUT}$.

As conceptually represented in the figure, according to an embodiment, the impedance network $R_1$ may be a variable impedance network whose impedance value $R_1$ is controlled according to the control signal $S_{OUT}$ (and, hence, according to the output current $I_{OUT}$). Therefore, in this embodiment, in order to obtain a low-side supply voltage $V_{LS}$ that is variable according to the output current $I_{OUT}$, the reference current $I_{REF,LS}$ generated by the reference current generator $205_1$ is variable according to the output current $I_{OUT}$. In this embodiment, the impedance network $R_2$ may instead be a conventional impedance network whose impedance value $R_2$ is fixed.

As conceptually represented in the figure, according to an embodiment, the impedance network $R_2$ may be a variable impedance network whose impedance value $R_2$ is controlled according to the control signal $S_{OUT}$ (and, hence, according to the output current $I_{OUT}$). In this embodiment, the impedance network $R_1$ may instead be a conventional impedance network whose impedance value $R_1$ is fixed. Therefore, in this embodiment, in order to obtain a low-side supply voltage $V_{LS}$ that is variable according to the output current $I_{OUT}$, the reference current $I_{REF,LS}$ generated by the reference current generator $205_1$ is fixed, whereas the reference voltage $V_{REF,LS}$ generated by the reference voltage generator $205_1$ is variable according to the output current $I_{OUT}$.

Therefore, regardless of the fact that the electrical amount that is adjustable according to the output current $I_{OUT}$ is the reference current $I_{REF,LS}$ or the reference voltage $V_{REF,LS}$, in any case the impedance network $R_1$ and/or the impedance network $R_2$ may be changed (according to the control signal $S_{OUT}$) so that the reference voltage $V_{REF,LS}$ (and, hence, the low-side supply voltage $V_{LS}$) is equal to the amount $Z_{eq}*I_{OUT}$ that minimizes the power loss $P_{loss}$ of the switching converter 100.

Without losing generality, embodiments in which the impedance network $R_1$ is a variable impedance network and the impedance network $R_2$ is a fixed impedance network are particularly advantageous. Indeed, in practical (and optimized) implementations, in order to obtain a decrease in the low-side supply voltage $V_{LS}$ in response to a decrease in the output current $I_{OUT}$, modulating the reference current $I_{REF,LS}$ (thanks to the variable impedance network $R_1$) allows reducing power consumption (on the contrary, modulating the reference voltage $V_{REF,LS}$ through the variable impedance network $R_2$ would involve higher power consumption through the third circuit branch identified by third mirroring transistors $225_C, 230_C$).

Moreover, in practical (and optimized) implementations, the impedance network $R_2$ may be used to generate the high-side supply voltage $V_{HS}$, whereby the impedance network $R_2$ may be shared by the low-side and high-side voltage generation stages (as better discussed in the following).

According to an embodiment, the low-side voltage generation stage 125 comprises an output stage $205_3$ configured to provide the low-side supply voltage $V_{LS}$ according to the reference voltage $V_{REF,LS}$.

According to an embodiment, the low-side supply voltage $V_{LS}$ provided by the output stage $205_3$ corresponds to the reference voltage $V_{REF,LS}$.

According to an embodiment, the low-side supply voltage $V_{LS}$ provided by the output stage $205_3$ is equal to the reference voltage $V_{REF,LS}$.

According to an embodiment, the output stage $205_3$ is configured to provide the reference voltage $V_{REF,LS}$ without power absorption from the third circuit branch identified by the third mirroring transistors $225_C, 230_C$. Therefore, in this embodiment, the output stage $205_3$ acts as a decoupling stage for decoupling the low-side voltage generation stage 125 and the low-side driver $110_{LS}$ to each other.

According to an embodiment, the output stage $205_3$ comprises an output transistor 235 (e.g., a NMOS transistor) having a drain terminal electrically coupled (e.g., directly connected) to the input terminal $T_{IN}$, a gate terminal electrically coupled (e.g., directly connected) to the first terminal of the impedance network $R_2$ so as to receive the reference voltage $V_{REF,LS}$, and a source terminal electrically coupled to the low-side driver $110_{LS}$, and an output transistor 240 (e.g., a PMOS transistor) having a source terminal electrically coupled (e.g., directly connected) to a drain terminal of the output transistor 235, a gate terminal electrically coupled (e.g., directly connected) to the gate terminal of the output transistor 235, and a drain terminal electrically coupled (e.g., directly connected) to the ground terminal $T_{GND}$.

In other words, the output transistors 235,240 implement a push-pull configuration in which the reference voltage $V_{REF,LS}$ is transferred unchanged from the gate terminals of the output transistors 235, 240 to the source terminals of the output transistors 235,240 (and, hence, to the low-side driver $110_{LS}$). Particularly, when the reference voltage $V_{REF,LS}$ equals the low-side supply voltage $V_{LS}$, the output stage $205_3$ is in an equilibrium condition in which the output transistors 235,240 are both in the OFF state; an increase or decrease of the reference voltage $V_{REF,LS}$ from the equilibrium condition determines the output transistor 235 or the output transistor 240, respectively, to switch into the ON state until the low-side supply voltage $V_{LS}$ at the respective source terminal has reached the reference voltage $V_{REF,LS}$.

Figure 3:
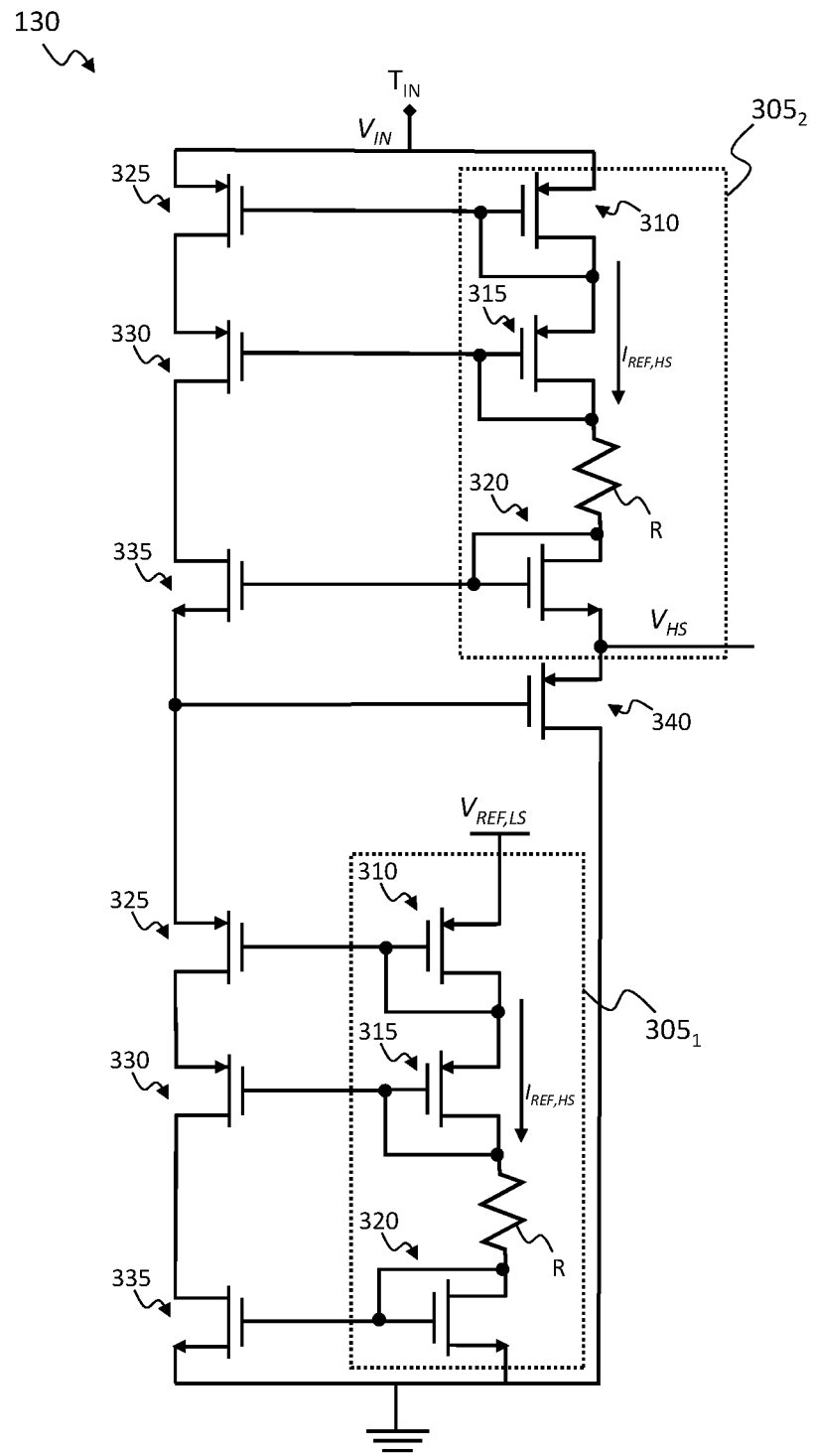
FIG. 3 shows a circuit implementation of a voltage generation stage of the switching converter according to an embodiment of the present invention.

With reference now to FIG. 3, it shows a circuit implementation of the high-side voltage generation stage 130 according to an embodiment of the present invention.

According to an embodiment, the high-side voltage generation stage 130 comprises a reference current generator $305_1$ configured to generate a reference current $I_{REF,HS}$.

According to an embodiment, as illustrated, the reference current generator $305_1$ is configured to generate the reference current $I_{REF,HS}$ based on the low-side supply voltage $V_{LS}$ (or on the reference voltage $V_{REF,LS}$, in an optimized implementation herein considered and discussed in the following) determined at the low-side voltage generation stage 125.

According to an embodiment, the reference current generator $305_1$ comprises an impedance network electrically coupled between a terminal providing the reference voltage $V_{REF,LS}$ and the ground terminal $T_{GND}$.

According to an embodiment, the impedance network comprises a number of (e.g., three) transistors (hereinafter, dividing transistors), for example MOS transistors, in diode-connected configuration.

According to an embodiment, the impedance network comprises a first dividing transistor 310 (e.g., a PMOS transistor) having a source terminal receiving the reference voltage $V_{REF,LS}$, and gate and drain terminals electrically coupled (e.g., directly connected) to each other, a second dividing transistor 315 (e.g., a PMOS transistor) having a source terminal electrically coupled (e.g., directly connected) to the drain terminal of the first dividing transistor 310, and gate and drain terminals electrically coupled (e.g., directly connected) to each other, and a third dividing transistor 320 (e.g., a NMOS transistor) having a drain terminal electrically coupled to the drain terminal of the second dividing transistor 315, a gate terminal electrically coupled (e.g., directly connected) to the respective drain terminal, and a source terminal electrically coupled (e.g., directly connected) to the ground terminal $T_{GND}$.

According to an embodiment, the impedance network comprises a dividing resistor R (or more thereof, in alternative embodiments of the present invention). According to an embodiment, the drain terminal of the third dividing transistor 320 is electrically coupled to the drain terminal of the second dividing transistor 315 by interposition of the dividing resistor R. According to an embodiment, the dividing resistor R comprises a first terminal electrically coupled (e.g., directly connected) to the drain terminal of the dividing transistor 315 and a second terminal electrically coupled (e.g., directly connected) to the drain terminal of the dividing transistor 320.

According to well-known principles of voltage dividers, the reference voltage $V_{REF,LS}$ is divided across the drain terminals of the dividing transistors based on an equivalent impedance between each drain terminal and the ground terminal $T_{GND}$. The reference current $I_{REF,HS}$ flowing through the impedance network may therefore be expressed as the ratio between the voltages at the drain terminals of the second 315 and third 320 dividing transistors and a resistance value of the dividing resistor R.

According to an embodiment, the high-side voltage generation stage 130 comprises a high-side supply voltage generator $305_2$ configured to receive the reference current $I_{REF,HS}$ and the input voltage $V_{IN}$ and to generate the high-side supply voltage $V_{HS}$ according thereto.

According to an embodiment, the high-side supply voltage generator $305_2$ is based on an impedance network. According to an embodiment, the impedance network of the high-side supply voltage generator $305_2$ is equal to the impedance network of the reference current generator $305_1$. In other words, the impedance network of the high-side supply voltage generator $305_2$ has same implementation as the impedance network of the reference current generator $305_1$ (i.e., it comprises the first 310, second, 315 and third 320 dividing transistors and the dividing resistor R) and same sizing (i.e., with the dividing transistors 310,315,320 and the dividing resistor R of the high-side supply voltage generator $305_2$ that dimensionally match the dividing transistors 310,315,320 and the dividing resistor R of the reference current generator $305_1$, respectively).

In alternative embodiments (not shown), the impedance network of the high-side supply voltage generator $305_2$ may have different implementation and/or different sizing with respect to the impedance network of the reference current generator $305_1$: this could be the case of, for example, embodiments in which a supply voltage drop of the high-side driver $110_{HS}$ different from the supply voltage drop of the low-side driver $110_L$ has to be obtained from the low-side supply voltage $V_{LS}$ (or from the reference voltage $V_{REF,LS}$).

According to an embodiment, the source terminal of the first dividing transistor 310 of the high-side supply voltage generator $305_2$ is electrically coupled (e.g., directly connected) to the input terminal $T_{IN}$ (for receiving the input voltage $V_{IN}$). Therefore, upon reception of the reference current $I_{REF,HS}$ from the reference current generator $305_1$, a same voltage drop (equal to the reference voltage $V_{REF,LS}$) is experienced across the impedance network of the reference current generator $305_1$ and across the impedance network of the high-side supply voltage generator $305_2$, and a high-side supply voltage $V_{HS}$ equal to:

$$V_{HS}=V_{IN}-V_{REF,LS}$$

is generated at the source terminal of the third dividing transistor 320 of the high-side supply voltage generator $305_2$.

In the example at issue in which $V_{REF,LS}=V_{LS}$, the high-side supply voltage $V_{HS}$ generated at the source terminal of the third dividing transistor 320 of the high-side supply voltage generator $305_2$ is equal to:

$$V_{HS}=V_{IN}-V_{LS}$$

According to an embodiment, each one of the reference current generator $305_1$ and the high-side supply voltage generator $305_2$ comprises a respective current mirror arrangement for providing the reference current $I_{REF,HS}$ from the impedance network of the reference current generator $305_1$ to the impedance network of the high-side supply voltage generator $305_2$.

According to an embodiment, each current mirror arrangement comprises a first mirroring transistor 325 (e.g., a PMOS transistor) having gate terminal electrically coupled (e.g., directly connected) to the gate terminal of the first dividing transistor 310 of the respective impedance network, a second mirroring transistor 330 (e.g., a PMOS transistor) having a source terminal electrically coupled (e.g., directly connected) to a drain terminal of the first mirroring transistor 325 and a gate terminal electrically coupled (e.g., directly connected) to the gate terminal of the second dividing transistor 315 of the respective impedance network, and a third mirroring transistor 335 (e.g., a NMOS transistor) having a drain terminal electrically coupled (e.g., directly connected) to the drain terminal of the second mirroring transistor 330 and a gate terminal electrically coupled (e.g., directly connected) to the gate terminal of the third dividing transistor 320 of the respective impedance network.

According to an embodiment, the current mirror arrangement of the reference current generator $305_1$ and the current mirror arrangement of the high-side supply voltage generator $305_2$ are electrically coupled to each other between the input terminal $T_{IN}$ and the ground terminal $T_{GND}$. In order to achieve it, according to an embodiment, a source terminal of the first mirroring transistor 325 of the reference current generator $305_1$ is electrically coupled (e.g., directly connected) to a source terminal of the third mirroring transistor 335 of the high-side supply voltage generator $305_2$, a source terminal of the first mirroring transistor 325 of the high-side supply voltage generator $305_2$ is electrically coupled (e.g., directly connected) to the input terminal $T_{IN}$, and a source terminal of the third mirroring transistor 335 of the reference current generator $305_1$ is electrically coupled (e.g., directly connected) to the ground terminal $T_{GND}$. In this way, the reference current $I_{REF,HS}$ from the impedance network of the reference current generator $305_1$ is mirrored to the respective current mirror arrangement, then it is caused to flow to the current mirror arrangement of the high-side supply voltage generator $305_2$, and hence it is mirrored to the respective the impedance network.

According to an embodiment, the high-side voltage generation stage 130 comprises a clamping device for absorbing current peaks from high-side driver $110_{HS}$. According to an embodiment, the clamping device comprises a clamping transistor 340 electrically coupled between the high-side supply voltage generator $305_2$ and the ground terminal $T_{GND}$. According to an embodiment, the clamping transistor 340 comprises a PMOS transistor having a source terminal electrically coupled (e.g., directly connected) to the source terminal of the third dividing transistor 320 of the high-side supply voltage generator $305_2$, a gate terminal electrically coupled (e.g., directly connected) to the source terminal of the third mirroring transistor 335 of the high-side supply voltage generator $305_2$, and a drain terminal electrically coupled (e.g., directly connected) to the ground terminal $T_{GND}$.

According to an embodiment, as mentioned above, the impedance network $R_2$ of the reference voltage generator $205_2$ of the low-side voltage generation stage 125 is equal to the impedance network of the reference current generator $305_1$ of the high-side voltage generation stage 130.

According to an embodiment, the high-side voltage generation stage 130 shares the impedance network of the reference current generator $305_1$ with the reference voltage generator $205_2$ of the low-side voltage generation stage 125, thus the impedance network $R_2$ of the reference voltage generator $205_2$ of the low-side voltage generation stage 125 acts also as the impedance network of the reference current generator $305_1$ of the high-side voltage generation stage 130 (as should be understood, conveniently, in this embodiment the impedance network $R_2$ is a fixed impedance network and the impedance network $R_1$ is a variable impedance network). This embodiment represents a practical and optimized implementation that allows obtaining a switching converter having power loss optimization with substantially no or negligible additional area occupation.

Figure 4:
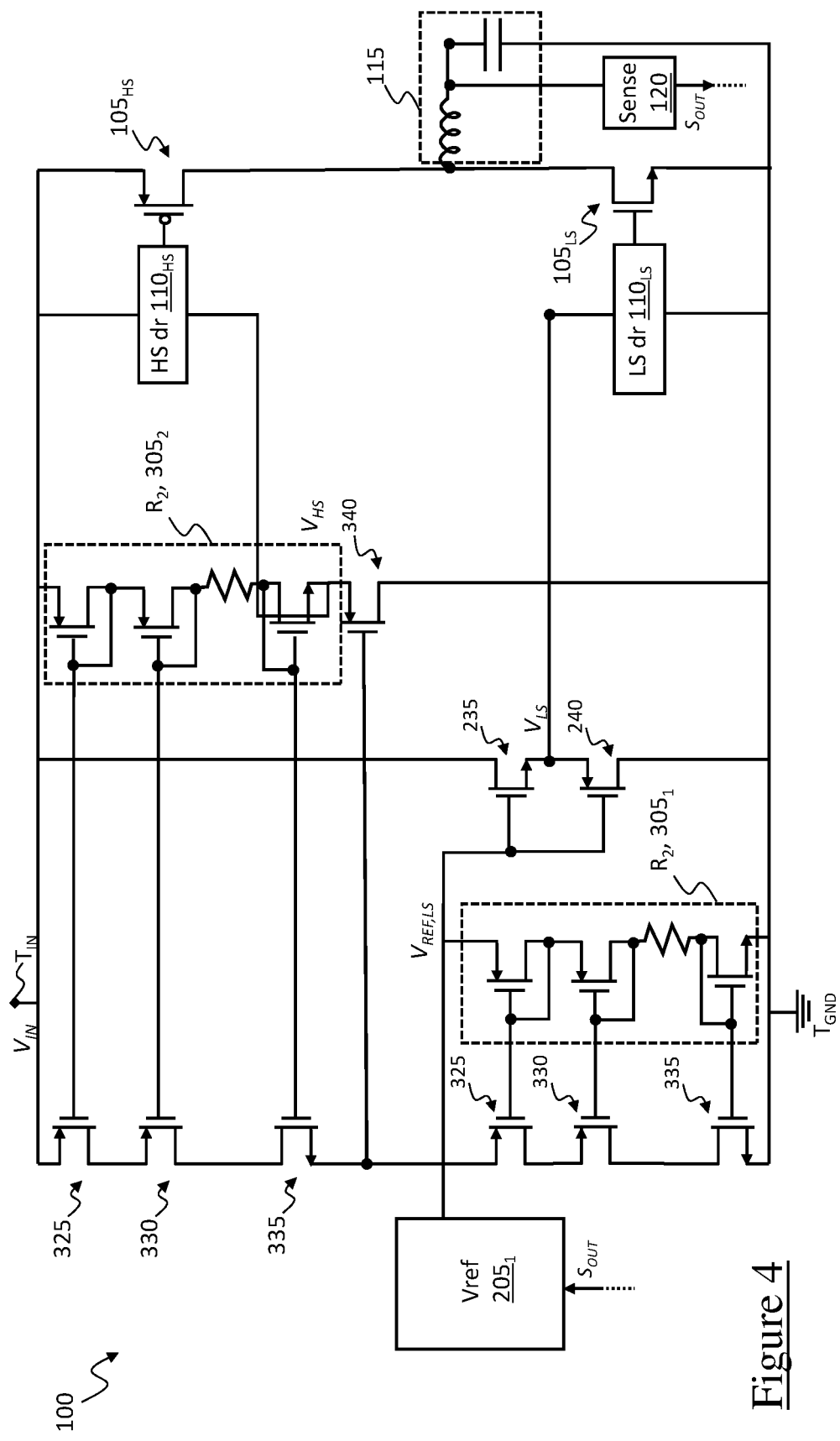
FIG. 4 shows an optimized circuit implementation of the switching converter according to an embodiment of the present invention.

A circuit diagram of the switching converter 100 featuring such an optimized implementation is shown in FIG. 4.

Figure 5:
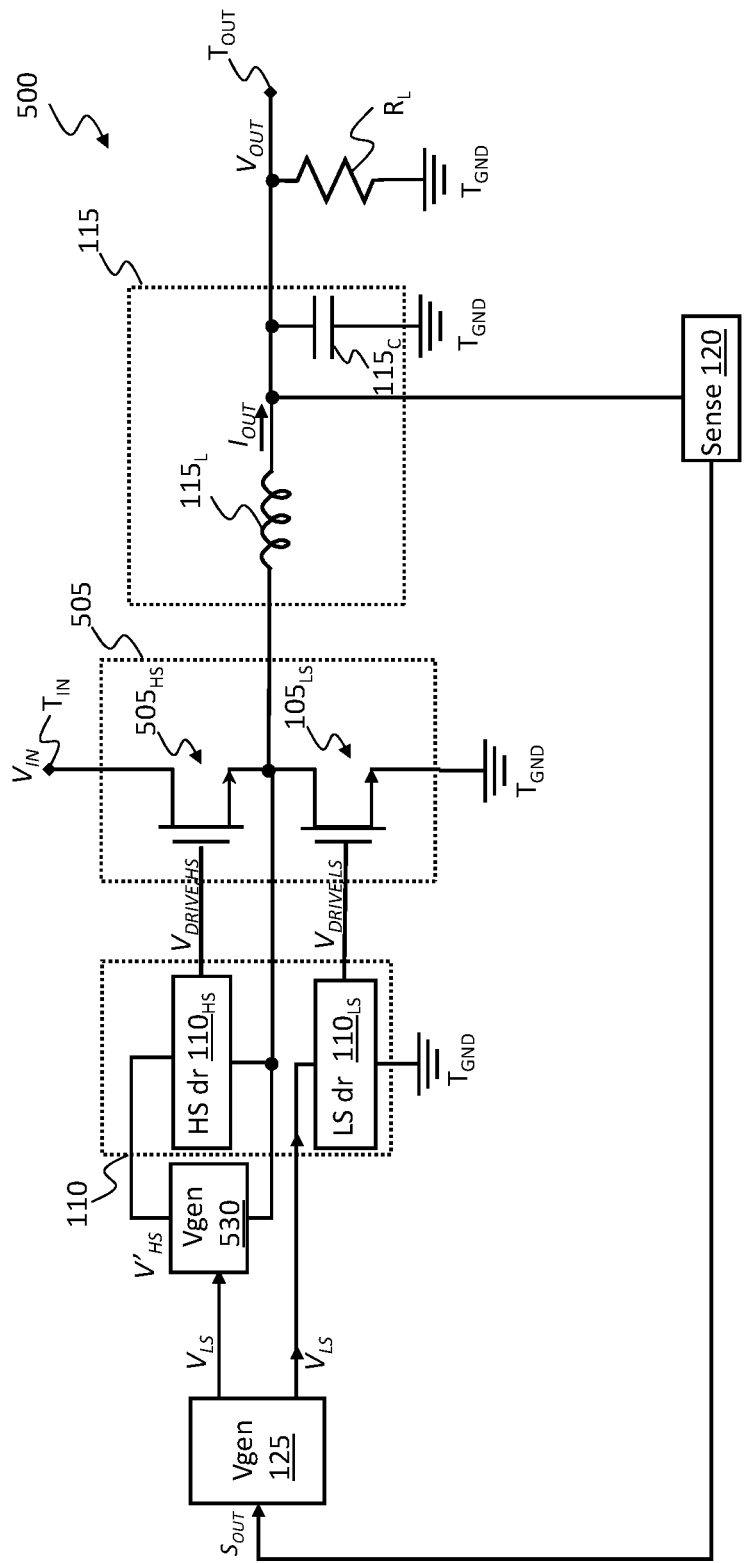
FIG. 5 shows a simplified circuit diagram of a switching converter according to another embodiment of the present invention.

With reference now to FIG. 5, it shows a circuit diagram of a switching converter 500 according to another embodiment of the present invention.

In the following, when one or more features of the switching converter 500 are introduced by the wording "according to an embodiment", they are to be construed as features additional or alternative to any features previously introduced, unless otherwise indicated and/or unless there is evident incompatibility among feature combinations.

The switching converter 500 is similar to the switching converter 100. In the following, elements of the switching converter 500 already discussed in connection with the switching converter 100 will not be discussed again for the sake of conciseness.

According to an embodiment, the switching converter 500 comprises the input terminal $T_{IN}$ providing the input voltage $V_{IN}$, and the output terminal $T_{OUT}$ providing the output voltage $V_{OUT}$.

According to an embodiment, the switching converter 500 comprises a switching stage 505 for receiving the input voltage $V_{IN}$ and for providing the output voltage $V_{OUT}$ according to the input voltage $V_{IN}$ and to a driving signal driving the switching stage 505.

According to an embodiment, the switching stage 505 comprises a high-side switching device $505_{HS}$ and the low-side switching device $105_{LS}$.

Differently from the switching stage 105, the high-side switching device $505_{HS}$ of the switching stage 505 comprises a NMOS transistor (which allows reducing area occupation and costs compared to PMOS transistor). In the exemplary considered embodiment, the NMOS transistor implementing the high-side switching device $505_{HS}$ comprises a drain terminal electrically coupled (e.g., directly connected) to the input terminal $T_{IN}$ for receiving the input voltage $V_{IN}$, a gate terminal for receiving the high-side driving signal $V_{DRIVE,HS}$, and a source terminal electrically coupled to the output terminal $T_{OUT}$ of the switching converter 500 and electrically coupled (e.g., directly connected) to the drain terminal of the NMOS transistor implementing the low-side switching device $105_{LS}$.

Therefore, in the considered embodiment, the switching stage 505 implements a so-called NMOS-NMOS half-bridge configuration.

According to an embodiment, the switching converter 500 comprises the driving stage 110 for driving the switching stage 505.

As discussed above, the driving stage 110 comprises the high-side driver $110_{HS}$ for providing to the high-side switching device $505_{HS}$ (particularly, to the gate terminal of the NMOS transistor) the high-side driving signal $V_{DRIVE,HS}$, and the low-side driver $110_{LS}$ for providing to the low-side switching device $105_{LS}$ (particularly, to the gate terminal of the NMOS transistor) the low-side driving signal $V_{DRIVE,LS}$. As discussed above, depending on the value of the respective driving signal $V_{DRIVE,HS}, V_{DRIVE,LS}$, each switching device $505_{HS}, 105_{LS}$ may take the closed or ON state in which an electric current is allowed to flow across it, and the open or OFF state in which no electric current is allowed to flow across it.

As discussed above, the low-side driver $110_{LS}$ is powered between the low-side supply voltage $V_{LS}$ and the ground voltage.

Similarly to the switching converter 100, the high-side driver $110_{HS}$ is powered between a high or relatively high supply voltage (hereinafter, first high-side supply voltage $V'_{HS}$) at a first supply terminal of the high-side driver $110_{HS}$, and a low or relatively low supply voltage (hereinafter, second high-side supply voltage $V''_{HS}$) at a second supply terminal of the high-side driver $110_{HS}$. Differently from the switching converter 100, the second high-side supply voltage $V''_{HS}$ corresponds to the voltage at the source terminal of the NMOS transistor implementing the high-side switching device $505_{HS}$ (as illustrated in the figure by electrical connection between such source terminal and the second high-side supply terminal of the high-side driver $110_{HS}$), and the first high-side supply voltage $V'_{HS}$ corresponds to a shifted version of the second high-side supply voltage $V''_{HS}$ (wherein the first high-side supply voltage $V'_{HS}$ is shifted with respect to the second high-side supply voltage $V''_{HS}$, for example by a voltage corresponding to the low-side supply voltage $V_{LS}$, as better discussed in the following).

As discussed above, the switching converter 500 comprises the filtering stage 115 electrically coupled to the switching stage 505.

As discussed above, the switching converter 500 is configured to be electrically coupled to one or more modules of an electronic system. Such modules are conceptually represented in the figure by the load resistor $R_L$.

As discussed above, the switching converter 500 comprises the sensing arrangement 120 configured to sense the output current $I_{OUT}$.

As discussed above, the switching converter 500 comprises the low-side voltage generation stage 125 configured to generate the low-side supply voltage $V_{LS}$ according to the control signal $S_{OUT}$.

According to an embodiment, the switching converter 500 comprises a high-side voltage generation stage 530 configured to generate the first high-side supply voltage $V'_{HS}$ according to the low-side supply voltage $V_{LS}$. However, in alternative embodiments (not shown), the high-side voltage generation stage 530 may be configured to generate the first high-side supply voltage $V'_{HS}$ irrespective of the low-side supply voltage $V_{LS}$. In these alternative embodiments, the low-side voltage generation stage 125 and the high-side voltage generation stage 530 may be independent from each other, i.e., they may be configured to generate the respective low-side supply voltage $V_{LS}$ and the first and second high-side supply voltages in an uncorrelated manner (e.g., based on mutually different reference voltages received at their inputs), irrespective of the fact that the supply voltage drop of the high-side driver $110_{HS}$ is equal to or different from the supply voltage drop of the low-side driver $110_L$.

Figure 6:
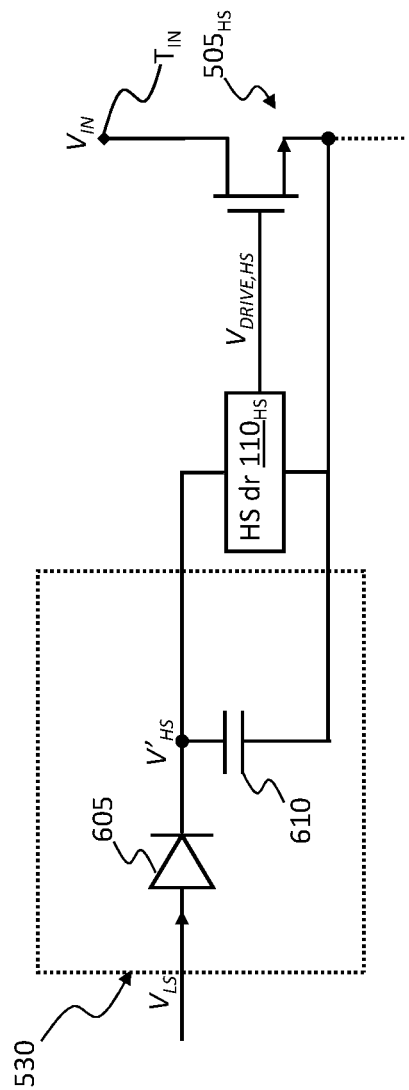
FIG. 6 shows a circuit implementation of a voltage generation stage of the switching converter of FIG. 5 according to an embodiment of the present invention.

A circuit implementation of the high-side voltage generation stage 530 according to an embodiment of the present invention is shown in FIG. 6.

According to an embodiment, the high-side voltage generation stage 530 comprises a step-up (or bootstrap) circuit for allowing a correct driving of the high-side switching device $505_{HS}$ (particularly, for ensuring that the voltage between the gate and the source terminals of the NMOS transistor implementing the high-side switching device $505_{HS}$ is sufficient to completely switch it in the ON state).

According to an embodiment, the bootstrap circuit comprises a diode (for example, an internal diode) 605 and a bootstrap capacitor (for example, an external bootstrap capacitor) 610. In alternative embodiments, not shown, switching units other than the diode 605 may be used; just as an example, a properly controlled switching transistor (not shown) may be used in alternative to the diode 605.

According to an embodiment, the diode 605 has an anode terminal electrically coupled (e.g., directly connected) to the source terminals of the output transistors 235,240 of the low-side voltage generation stage 125 for receiving the low-side supply voltage $V_{LS}$ (the anode terminal of the diode 605 being thus electrically coupled to the low-side supply terminal), and a cathode terminal providing the first high-side supply voltage $V'_{HS}$ (the cathode terminal of the diode 605 being thus electrically coupled to the first high-side supply terminal of the high-side driver $110_{HS}$).

According to an embodiment, the bootstrap capacitor 610 has a first terminal electrically coupled (e.g., directly connected) to the cathode terminal of the diode 605 (and, hence, to the first high-side supply terminal of the high-side driver $110_{HS}$), and a second terminal electrically coupled (e.g., directly connected) to the second high-side supply terminal and to the source terminal of the NMOS transistor implementing the high-side switching device $505_{HS}$.

According to well-known principles of the bootstrap circuits, the voltage across the bootstrap capacitor 61o, and hence the voltage across the gate and source terminals of the NMOS transistor implementing the high-side switching device $505_{HS}$ is equal to:

$$V'_{HS} - V''_{HS} = V_{LS} = V_{CC}$$

which ensures that the voltage between the gate and the source terminals of the NMOS transistor implementing the high-side switching device $505_{HS}$ is sufficient to completely switch it in the ON state.

In other words, the bootstrap circuit is configured to keep the first high-side supply voltage $V'_{HS}$ referred to the voltage at the source terminal of the NMOS transistor implementing the high-side switching device $505_{HS}$ (i.e., the second high-side supply voltage $V''_{HS}$), regardless of the input voltage $V_{IN}$, whereby the voltage that the high-side driver $110_{HS}$ applies between the gate and the source terminals of the NMOS transistor implementing the high-side switching device $505_{HS}$ is sufficient to switch it to the ON state regardless of the input voltage $V_{IN}$.

In the example at issue, the bootstrap circuit is configured to keep the voltage between the gate and source terminals of the NMOS transistor implementing the high-side switching device $505_{HS}$ at the supply voltage drop $V_{CC}$ regardless of the input voltage $V_{IN}$. In alternative embodiments, not shown, the bootstrap circuit may be configured to receive (e.g., at the anode terminal of the diode 605) an operative voltage different from the low-side supply voltage $V_{LS}$: this could be the case of, for example, embodiments in which a supply voltage drop of the high-side driver $510_{HS}$ different from the supply voltage drop of the low-side driver $110_L$ has to be obtained.

Figure 7:
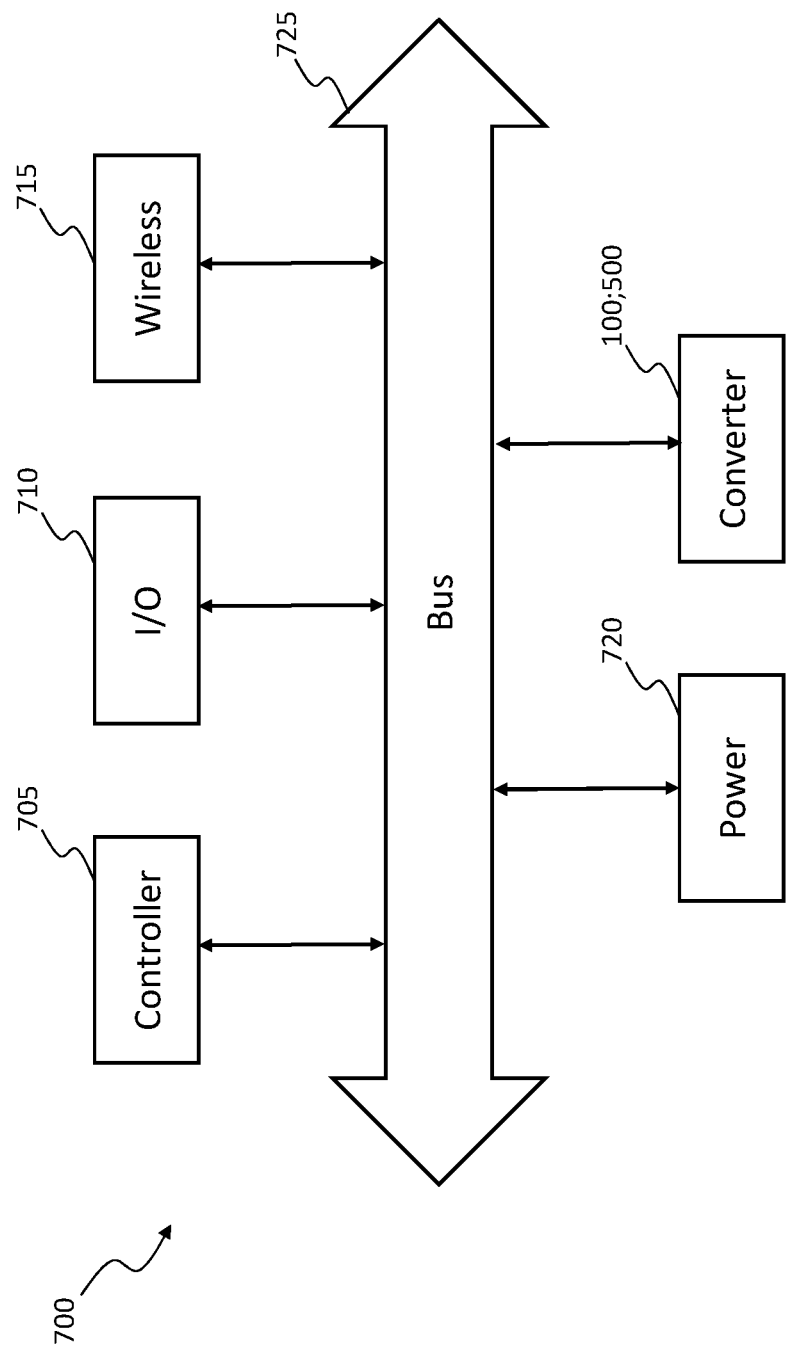
FIG. 7 shows a simplified block diagram of an electronic system comprising the switching converter of FIGS. 1 and 5 according to an embodiment of the present invention.

With reference now to FIG. 7, it shows a simplified block diagram of an electronic system 700 (i.e., a portion thereof) comprising the switching converter 100 (or more thereof) or the switching converter 500 (or more thereof) according to an embodiment of the present invention.

According to an embodiment, the electronic system 700 is suitable for use in any electronic apparatus.

According to an embodiment, the electronic system 700 comprises a controller 705 (for example, one or more microprocessors and/or one or more microcontrollers).

According to an embodiment, the electronic system 700 comprises an input/output device 710 (for example, a keyboard and/or a screen). The input/output device 710 may for example be used to generate and/or receive messages. The input/output device 710 may for example be configured to receive/supply a digital signal and/or an analog signal.

According to an embodiment, the electronic system 700 comprises a wireless interface 715 for exchanging messages with a wireless communication network (not shown), for example by using radio frequency signals. Examples of a wireless interface may include antennas and wireless transceivers.

According to an embodiment, the electronic system 700 comprises a power supply device (for example, a battery) 720 for powering the electronic system 700.

According to an embodiment, the electronic system 700 comprises one more communication channels (bus) 725 to allow the exchange of data between the switching converter, the controller 705 (when provided), the input/output device 710 (when provided), the wireless interface 715 (when provided), and the power supply device 720 (when provided).

Naturally, in order to satisfy local and specific requirements, a person skilled in the art may apply to the embodiments described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

In particular, similar considerations apply if the switching converter has a different structure or includes equivalent components. In any case, any component thereof may be separated into several elements, or two or more components may be combined into a single element; furthermore, each component can be replicated to support the execution of the corresponding operations in parallel. It should also be noted that (unless otherwise indicated) any interaction between different components generally does not need to be continuous, and may be either direct or indirect through one or more intermediaries.

What is claimed is:

1. A switching converter for converting a direct current input voltage into a direct current output voltage, the switching converter comprising:
a switching stage configured to receive the input voltage, receive a driving signal for driving the switching stage, and provide the output voltage according to the input voltage and the driving signal;
a driving stage configured to provide the driving signal to the switching stage;
a current sensing circuit configured to sense an output current provided by the switching stage; and
a voltage generation circuit configured to generate at least one supply voltage for powering the driving stage, and adjust the at least one supply voltage according to the output current,
wherein the switching stage comprises first and second switching devices, wherein the driving stage comprises first and second driving devices configured to drive the first and second switching devices, respectively, and wherein the voltage generation circuit comprises a first voltage generation stage configured to generate, according to the output current, a first supply voltage for powering the second driving device, and a second voltage generation stage configured to generate a second supply voltage for powering the first driving device, and
wherein the second voltage generation stage is configured to generate the second supply voltage according to a reference voltage corresponding to the first supply voltage.

2. The switching converter of claim 1, wherein the first voltage generation stage comprises a decoupling stage configured to provide, according to the reference voltage, the first supply voltage while electrically decoupling the first voltage generation stage and the second driving device to each other.

3. The switching converter of claim 1, wherein the first voltage generation stage comprises a reference current generator configured to generate a first reference current, and a reference voltage generator configured to generate, according to the first reference current, the reference voltage, wherein the first reference current or the reference voltage is configured to be adjustable according to the output current.

4. The switching converter of claim 3, wherein the first reference current is configured to be adjustable according to the output current.

5. The switching converter of claim 3, wherein the reference voltage is configured to be adjustable according to the output current.

6. The switching converter of claim 3, wherein the first switching device comprises a PMOS transistor and the second switching device comprises a NMOS transistor, wherein the second voltage generation stage comprises a first impedance network configured to receive the first supply voltage and to provide a corresponding second reference current, a second impedance network configured to receive the input voltage and the second reference current and to provide the second supply voltage, and a current mirror arrangement configured to mirror the second reference current from the first impedance network to the second impedance network.

7. The switching converter of claim 6, wherein the first reference current is adjustable according to the output current and the reference voltage generator comprises a third impedance network, the third impedance network being equal to the first impedance network.

8. The switching converter of claim 7, wherein the second voltage generation stage shares the first impedance network with the reference voltage generator of the first voltage generation stage, and wherein the third impedance network of the reference voltage generator is configured to act as the first impedance network of the second voltage generation stage.

9. The switching converter of claim 3, wherein the first switching device comprises a first NMOS transistor and the second switching device comprises a second NMOS transistor, and wherein the second voltage generation stage comprises a bootstrap circuit configured to:
receive the first supply voltage;
provide the second supply voltage; and
keep a voltage between gate and source terminals of the first NMOS transistor at the first supply voltage regardless of the input voltage.

10. The switching converter of claim 1, wherein the switching converter is a buck converter, a boost converter, or a buck-boost converter.

11. A switching converter comprising:
an input terminal configured to receive an input voltage;
a switching terminal configured to be coupled to an output node via an inductor;
a switching stage comprising a first input coupled to the input terminal, and an output coupled to the switching terminal, wherein the switching stage is configured to generate, at the output node, a regulated output voltage from the input voltage;
a driving stage configured to provide a driving signal to a second input of the switching stage;
a current sensing circuit configure to sense an output current provided by the switching stage; and
a voltage generation circuit configured to generate a first supply voltage for powering the driving stage, and adjust the first supply voltage according to the output current,
wherein the voltage generation circuit comprises a reference current generator configured to generate a first reference current, wherein the voltage generation circuit is configured to generate the first supply voltage based on the first reference current, and wherein the voltage generation circuit is configured to vary an impedance network of the voltage generation circuit according to the output current to adjust the first supply voltage.

12. A switching converter comprising:
an input terminal configured to receive an input voltage;
a switching terminal configured to be coupled to an output node via an inductor;
a switching stage comprising a first input coupled to the input terminal, and an output coupled to the switching terminal, wherein the switching stage is configured to generate, at the output node, a regulated output voltage from the input voltage;
a driving stage configured to provide a driving signal to a second input of the switching stage;
a current sensing circuit configure to sense an output current provided by the switching stage; and
a voltage generation circuit configured to generate a first supply voltage for powering the driving stage, and adjust the first supply voltage according to the output current,
wherein the switching stage comprises high-side and low-side switching devices, wherein the driving stage comprises high-side and low-side driving devices configured to drive the high-side and low-side switching devices, respectively, wherein the high-side driving device is configured to be powered by a first high supply voltage and a first low supply voltage that is lower than the first high supply voltage, wherein the low-side driving device is configured to be powered by a second high supply voltage and a second low supply voltage that is lower than the second high supply voltage, and wherein the second high supply voltage is the first supply voltage.

13. The switching converter of claim 12, wherein the first low supply voltage is based on the first supply voltage.

14. The switching converter of claim 13, wherein the first high supply voltage is the input voltage.

15. The switching converter of claim 12, wherein the first high supply voltage is based on the first supply voltage.

16. A method for converting a direct current input voltage into a direct current output voltage, the method comprising:
powering a driving stage with first and second supply voltages;
providing, by the driving stage, a driving signal to a switching stage;
receiving the input voltage with the switching stage;
providing, by the switching stage, an output current according to the input voltage and the driving signal;
sensing the output current;
adjusting the first and second supply voltages according to the output current; and
generating the second supply voltage according to a reference voltage corresponding to the first supply voltage.

17. The method of claim 16, wherein the output voltage is lower than the input voltage.

18. An electronic system comprising:
a battery;
a communication interface;
a controller; and
a switching converter comprising:
an input terminal configured to receive an input voltage;
an output terminal;
a switching stage comprising a first input coupled to the input terminal, and an output coupled to the output terminal, wherein the switching stage is configured to generate, at the output terminal, a regulated output voltage from the input voltage;
a driving stage configured to provide a driving signal to a second input of the switching stage;
a current sensing circuit configured to sense an output current provided by the switching stage; and
a voltage generation circuit configured to generate a first supply voltage for powering the driving stage, and adjust the first supply voltage according to the output current,
wherein the voltage generation circuit comprises a reference current generator configured to generate a first reference current, wherein the voltage generation circuit is configured to generate the first supply voltage based on the first reference current, and wherein the voltage generation circuit is configured to vary an impedance network of the voltage generation circuit according to the output current to adjust the first supply voltage.

* * * * *